United States Patent
Yagi

(10) Patent No.: US 7,989,955 B2
(45) Date of Patent: Aug. 2, 2011

(54) SEMICONDUCTOR DEVICE, ELECTRONIC DEVICE, AND METHOD OF PRODUCING SEMICONDUCTOR DEVICE

(75) Inventor: Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 483 days.

(21) Appl. No.: 12/108,718

(22) Filed: Apr. 24, 2008

(65) Prior Publication Data
US 2008/0265442 A1 Oct. 30, 2008

(30) Foreign Application Priority Data

Apr. 26, 2007 (JP) ................................. 2007-116372

(51) Int. Cl.
*H01L 23/48* (2006.01)
*H01L 23/52* (2006.01)
*H01L 29/40* (2006.01)
(52) U.S. Cl. ...................................... 257/758; 257/750
(58) Field of Classification Search .................. 257/750, 257/758, 632, 635
See application file for complete search history.

(56) References Cited

U.S. PATENT DOCUMENTS

| 5,661,344 | A  | * | 8/1997  | Havemann et al. | ............ | 257/758 |
| 5,847,460 | A  | * | 12/1998 | Liou et al.     | ............ | 257/751 |
| 6,040,243 | A  | * | 3/2000  | Li et al.       | ............ | 438/687 |
| 6,734,036 | B2 | * | 5/2004  | Chakrabarti et al. | ......... | 438/48  |
| 6,975,033 | B2 | * | 12/2005 | Ito et al.      | ............ | 257/761 |

FOREIGN PATENT DOCUMENTS

| JP | 05-029480   | 2/1993  |
| JP | 11-297693   | 10/1999 |
| JP | 2002-222859 | 8/2002  |

OTHER PUBLICATIONS

Christos D. Dimitrakopoulos and Patrick R. L. Malenfant; Organic Thin Film Transistors for Large Area Electronics; Advanced Materials; vol. 14, No. 2; 2002; p. 99-117.

Japanese Office Action issued on Apr. 28, 2009 corresponding to JP Patent Application No. 2007-116372.

* cited by examiner

*Primary Examiner* — S. V Clark
(74) *Attorney, Agent, or Firm* — SNR Denton US LLP

(57) ABSTRACT

A semiconductor device includes a first insulating film that includes a first opening reaching a substrate and that is provided on the substrate, a second insulating film that includes a second opening reaching the substrate through the first opening of the first insulating film and that covers the first insulating film, and a conductive pattern that is provided on the second insulating film so as to be in contact with the substrate through the second opening of the second insulating film.

7 Claims, 6 Drawing Sheets

SEMICONDUCTOR DEVICE, ELECTRONIC DEVICE, AND METHOD OF PRODUCING SEMICONDUCTOR DEVICE

CROSS REFERENCES TO RELATED APPLICATIONS

The present invention contains subject matter related to Japanese Patent Application JP 2007-116372 filed in the Japanese Patent Office on Apr. 26, 2007, the entire contents of which are incorporated herein by reference.

BACKGROUND OF THE INVENTION

1. Field of the Invention

The present invention relates to a semiconductor device, an electronic device, and a method of producing a semiconductor device, the devices being suitable for use in a structure including a semiconductor layer made of an organic material.

2. Description of the Related Art

Thin-film transistors (TFTs) are widely used as pixel transistors in electronic circuits, in particular, in active-matrix-driven flat display units. Recently, the use of an organic material as a semiconductor layer used for such a semiconductor device having a small thickness has attracted attention. In thin-film transistors including a semiconductor layer made of an organic material, i.e., organic thin-film transistors (OTFTs), the semiconductor layer can be deposited at a temperature lower than that in a structure including a semiconductor layer made of an inorganic material. Therefore, such organic thin-film transistors are advantageous in that thin-film transistors having a large area can be produced, and the organic thin-film transistors can be formed on a flexible substrate having poor heat resistance, e.g., a plastic substrate. Organic thin-film transistors are promising from the standpoint of realization of multifunctional devices and a reduction in cost.

Furthermore, in organic thin-film transistors, not only the semiconductor layer but also a gate insulating film, source-drain electrodes, and a gate electrode can be formed by a printing method or an evaporation method, and thus, the production cost can be further reduced. In general, the thicknesses of wirings for such source-drain electrodes and a gate electrode are in the range of 50 to 200 nm (refer to Christos D. Dimitrakopoulos and Patrick R. L. Malenfant, "Organic Thin-Film Transistors for Large Area Electronics", "Advanced Materials", Vol. 14, No. 2, 2002, pp. 99-117).

SUMMARY OF THE INVENTION

The evaporation method, which is preferably employed for forming electrodes and wirings in preparation of organic thin-film transistors, is a simple deposition method. However, the evaporation method is disadvantageous in that step coverage is not satisfactory because of high deposition anisotropy of the evaporation method.

In organic thin-film transistors, in order to maintain the flexibility of a substrate used for supporting elements, an organic insulating film is often used as an insulating film such as a gate insulating film or a protective film. However, such an organic insulating film has a low gas barrier property. Therefore, in the case where an organic insulating film is used as the protective film, in order to ensure the gas barrier property, it is necessary to form a protective film having a large thickness of several micrometers. Accordingly, when the resulting protective film is processed, for example, a connecting hole is formed in the protective film, the step is also large, i.e., several micrometers.

In this state, when a thin-film electrode material layer having a thickness in the range of about 50 to 200 nm is formed by the evaporation method, which would produce unsatisfactory step coverage as described above, a step disconnection is easily generated at an upper shoulder part of the step, thus causing a decrease in the yield.

It is desirable to provide a semiconductor device and an electronic device in which the yield is improved by providing a conductive pattern that is satisfactorily pattern-formed from the upper part to the lower part of a high step without the occurrence of a step disconnection, and a method of producing the semiconductor device.

A semiconductor device and an electronic device according to an embodiment of the present invention includes a first insulating film that includes a first opening reaching a substrate and that is provided on the substrate, a second insulating film that includes a second opening reaching the substrate through the first opening of the first insulating film and that covers the first insulating film, and a conductive pattern that is provided on the second insulating film so as to be connected to a conductive layer provided on the surface of the substrate through the second opening of the second insulating film.

In a method of producing a semiconductor device according to an embodiment of the present invention, first, a first insulating film that including a first opening reaching a substrate is pattern-formed on the substrate. Next, a second insulating film including a second opening reaching the substrate through the first opening of the first insulating film is formed so as to cover the first insulating film. Subsequently, a conductive pattern connected to a conductive layer formed on the surface of the substrate through the second opening of the second insulating film is formed on the second insulating film.

According to the above structure, the first insulating film formed by patterning is covered with the second insulating film. Accordingly, the upper shoulder parts of the first opening of the first insulating film are covered with the second insulating film so as to have a rounded shape thereat. As a result, a step disconnection of the conductive pattern, which is provided on the second insulating film, can be prevented at the upper shoulder parts of the first opening provided in the first insulating film.

As described above, according to the embodiments of the present invention, a conductive pattern can be provided on an insulating film in a state in which a step disconnection at an upper shoulder part in an opening of the insulating film is prevented. As a result, the yield in the semiconductor device and the electronic device can be improved.

DESCRIPTION OF THE PREFERRED EMBODIMENTS

Semiconductor devices and a display unit according to embodiments of the present invention will now be described in detail with reference to the drawings.

First Embodiment

Figure 1:
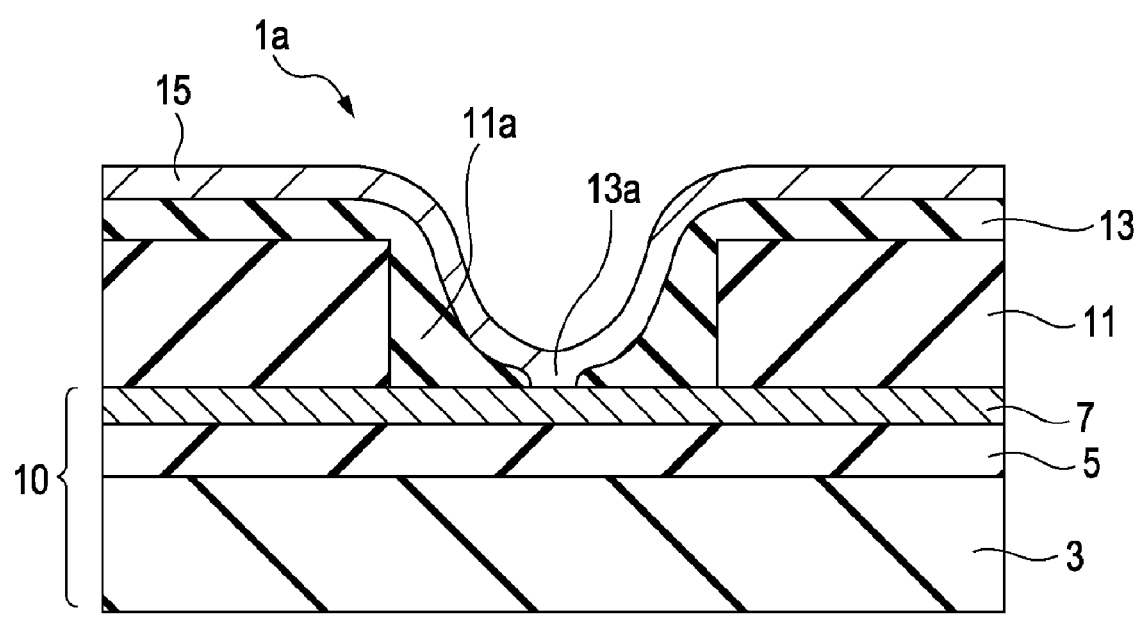
FIG. 1 is a cross-sectional view showing a semiconductor device of a first embodiment.

FIG. 1 is a cross-sectional view of the relevant part showing an example of a semiconductor device and an electronic device according to an embodiment of the present invention.

In a semiconductor device 1a show in FIG. 1, an interlayer insulating film 5 is provided on a supporting substrate 3 so as to cover a base structure (not shown) including an electrode and the like. A conductive layer 7 is pattern-formed on the interlayer insulating film 5. A first insulating film 11 including a connecting-hole-shaped opening (hereinafter referred to as "first opening") 11a reaching the conductive layer 7 is pattern-formed on a substrate 10 prepared as described above. A second insulating film 13 is provided on the first insulating film 11. A connecting-hole-shaped opening (hereinafter referred to as "second opening") 13a reaching the conductive layer 7 in the first opening 11a of the first insulating film 11 is provided in the second insulating film 13. A conductive pattern 15 connected to the conductive layer 7 through the second opening 13a is provided on the second insulating film 13.

In the first embodiment of the above-described structure, it is important that the second insulating film 13 cover upper shoulder parts and lower corner parts of the first opening 11a of the first insulating film 11 so as to have a rounded shape thereat.

Steps of producing the above-described structure will now be described with reference to production process views shown in FIGS. 2A to 2E.

Figure 2A:
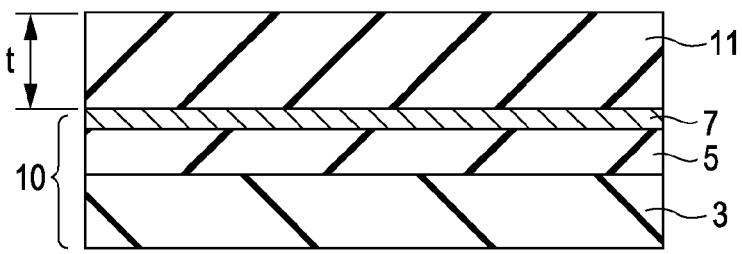
FIGS. 2A to 2E are cross-sectional process views showing steps of producing the semiconductor device of the first embodiment.

First, as shown in FIG. 2A, an insulating supporting substrate 3 is prepared. The material of the supporting substrate 3 is not particularly limited as long as the supporting substrate 3 is an insulating substrate. Examples of the material of the supporting substrate 3 include hard materials, such as glass, and soft plastic materials, such as polyethersulfone (PES) and polyethylene naphthalate (PEN). From the standpoint of a supporting substrate used for supporting members described below, the supporting substrate 3 may be a glass substrate or a plastic substrate having a protective film or a buffer layer thereon. For example, the supporting substrate 3 may have a structure in which a silicon nitride ($SiN_x$) thin film for a gas barrier is provided on a glass substrate. Alternatively, the supporting substrate 3 may have a structure in which, for example, a silicon nitride ($SiN_x$) thin film or an acrylic thin film for the surface protection and planarization is provided on a plastic film substrate.

Next, a base structure (not shown) including an electrode (e.g., gate electrode) and the like is formed on the supporting substrate 3, and an interlayer insulating film 5 is then deposited so as to cover the base structure. For example, the interlayer insulating film 5 is made of an inorganic material such as silicon oxide or silicon nitride, or an organic material such as polyvinylphenol or polymethylmethacrylate (PMMA). This interlayer insulating film 5 may be formed as, for example, a gate insulating film.

Subsequently, a conductive layer 7 is pattern-formed on the interlayer insulating film 5. This conductive layer 7 is, for example, a source electrode, a drain electrode, and other wirings. The conductive layer 7 is formed by patterning a gold (Au) film, a stacked film including a gold (Au) film and a chromium (Cr) film, a silver (Ag) film, a platinum (Pt) film, a palladium (Pd) film, or a stacked film of these films as a conductive pattern.

In addition to the conductive layer 7, any base structure including circuits, e.g., a transistor and a capacitor, and wirings may be formed as another base structure on the surface of a substrate 10 prepared as described above. Furthermore, any structure including, for example, an electrode layer, an insulating layer, and a semiconductor layer may be provided between the base structure and the interlayer insulating film 5.

Subsequently, a first insulating film 11 is deposited on the substrate 10 including the conductive layer 7 and optional other base structures. The first insulating film 11 is composed of an insulating film used in the related art. Specific examples of the first insulating film 11 include inorganic insulating films such as a silicon oxide ($SiO_x$) film and a silicon nitride ($SiN_x$) film; and organic insulating films such as a polyparaxylylene film, a polyvinylphenol film, acrylic resin films, e.g., a PMMA film, and a polyvinyl alcohol film. Techniques used in the related art, such as a CVD method, a sputtering method, and an application method can be widely used for depositing the first insulating film 11.

This first insulating film 11 has a thickness t such that the first insulating film 11 covers pattern layers that constitute an insulating film, a wiring, a semiconductor layer, and the like (not shown). Alternatively, in order to arrange a conductive pattern to be formed above the first insulating film 11, the first insulating film 11 may be formed as a planarizing insulating film. Furthermore, this first insulating film 11 may have a single-layer structure or a laminated structure. However, when the first insulating film 11 is composed of an organic insulating film, the first insulating film 11 has a large thickness t sufficient to the extent that the gas barrier property can be ensured or the insulating property that is necessary for driving the device can be ensured.

Figure 2B:
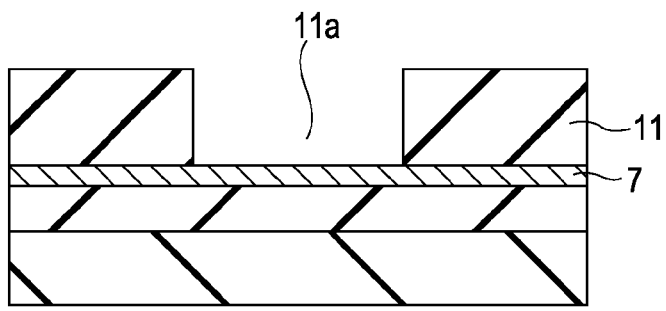

Next, as shown in FIG. 2B, a first opening 11a reaching the conductive layer 7 is formed in the first insulating film 11. The first opening 11a is formed by, for example, etching the first insulating film 11 using a resist pattern as a mask. Here, all openings that reach the conductive layer 7 and that are formed in the first insulating film 11 are the first openings 11a, and a plurality of first openings 11a may be provided according to need.

The formation of the first insulating film 11 and the formation of the first opening 11a may be simultaneously performed by, for example, a printing method. In this case, the first insulating film 11 is formed in a state in which the first opening 11a is formed in advance.

Figure 2C:
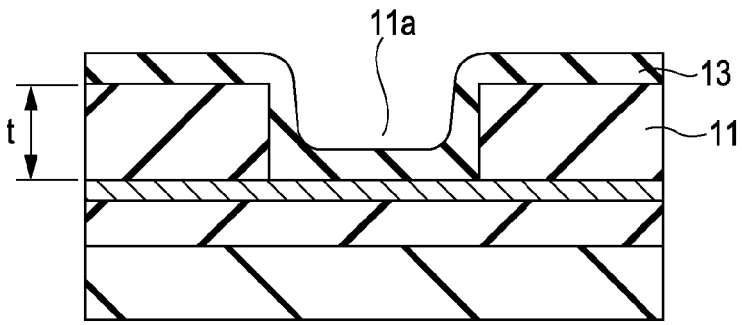

Subsequently, as shown in FIG. 2C, a second insulating film 13 is deposited so as to cover the first insulating film 11. Preferably, the second insulating film 13 is deposited so as to cover the corners of the first opening 11a in the first insulating film 11 in a rounded shape. This second insulating film 13 is formed by, for example, an application method. Considering the simplification of the process, the second insulating film 13 is preferably formed by applying a photosensitive resin. Herein, the term "photosensitive resin" means a photosensitive organic material represented by a photosensitive polyimide or a resist, and a material that can be patterned by a lithography process including an irradiation of an energy ray and a subsequent development.

Figure 2D:
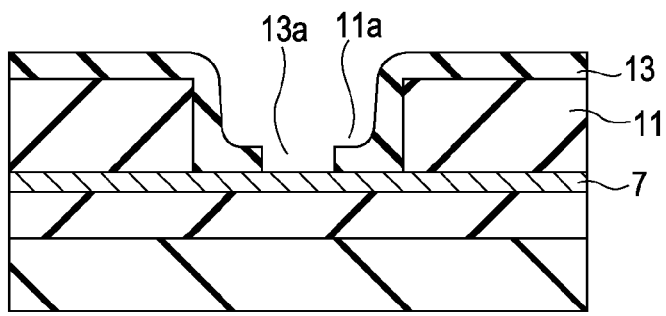

Subsequently, as shown in FIG. 2D, a second opening 13a reaching the conductive layer 7 is formed in the second insulating film 13 disposed in the first opening 11a of the first insulating film 11. In this step, when the second insulating film 13 is made of a photosensitive resin, the second opening 13a is formed in the second insulating film 13 by a lithography process. Here, all openings that are formed in the second insulating film 13 disposed in the first opening 11a of the first insulating film 11 are the second openings 13a, and a plurality of second openings 13a may be provided according to need.

The formation of the second insulating film 13 and the formation of the second opening 13a may be simultaneously performed by, for example, a printing method. In this case, the second insulating film 13 is formed in a state in which the second opening 13a is formed in advance.

Figure 2E:
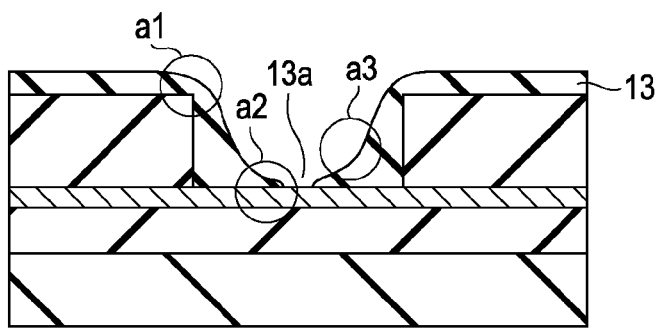

Subsequently, as shown in FIG. 2E, the second insulating film 13 including the second opening 13a is reflowed (fluidized) by a heat treatment. As a result, the portions of the second insulating film 13 covering the corners of the first opening 11a in the first insulating film 11 are further formed into a rounded shape. In particular, it is important that the second insulating film 13 cover each of upper shoulder parts a1 of the first opening 11a so as to have a rounded shape having a large curvature thereat. Each of upper shoulder parts a2 of the second opening 13a provided in the second insulating film 13 is also reflowed and formed into a rounded shape. Furthermore, each of lower corner parts a3 of the first opening 11a is also formed into a rounded shape.

When the material of the second insulating film 13 has a thermosetting property, the second insulating film 13 is cured by this heat treatment. The heat treatment for the reflow and the heat treatment for the heat curing may be performed in two steps. However, since the heat-curing temperature is generally higher than the reflow-starting temperature, the reflow is simultaneously performed during the heat treatment for the heat curing. When the material of the second insulating film 13 has photocurability, a heat treatment for the reflow is performed, and a light irradiation for the photo-curing is then performed.

Subsequently, as shown in FIG. 1, a conductive pattern 15 connected to the conductive layer 7 through the second opening 13a is formed on the second insulating film 13 to form wirings. The conductive pattern 15 can be formed by widely employing techniques used in the related art. For example, the conductive pattern 15 is formed by depositing an electrode material layer, forming a resist pattern by a lithography process, and then patterning the electrode material layer by etching using the resist pattern as a mask. Examples of the electrode material layer include an aluminum (Al) film, a gold (Au) film, a stacked film of a gold (Au) film and a chromium (Cr) film, a silver (Ag) film, a palladium (Pd) film, and a stacked film of these films. An evaporation method, which would produce unsatisfactory step coverage, may be employed for depositing the electrode material layer.

According to the above-described structure, the first insulating film 11 having the first opening 11a is covered with the second insulating film 13. Consequently, each of the upper shoulder parts of the first opening 11a can be covered with the second insulating film 13 and formed into a rounded shape. In particular, as described with reference to FIG. 2E, since the second insulating film 13 is composed of a reflow film, each of the upper shoulder parts a1 of the first opening 11a of the first insulating film 11, which is an underlayer, can be covered with the second insulating film 13 in a rounded shape having a larger curvature, each of the upper shoulder parts a2 of the second opening 13a of the second insulating film 13 is also formed into a rounded shape, and each of the lower corner parts a3 of the first opening 11a is also formed into a rounded shape.

Accordingly, a step disconnection of the conductive pattern 15, which is formed on the first insulating film 11 in a state in which the conductive pattern 15 is connected to the conductive layer 7 provided under the first insulating film 11, can be prevented at the upper shoulder parts of the connecting-hole-shaped first opening 11a, the upper shoulder parts of the second opening 13a in the second insulating film 13, and the lower corner parts of the first opening 11a. As a result, the conductive pattern 15 arranged on the insulating films 11 and 13 can be reliably connected to the conductive layer 7. In this case, even when the conductive pattern 15 is formed by an evaporation method, which would produce unsatisfactory step coverage, the step disconnection of the conductive pattern 15 can be prevented. Accordingly, the yield of the semiconductor device 1a can be improved.

Figure 3:
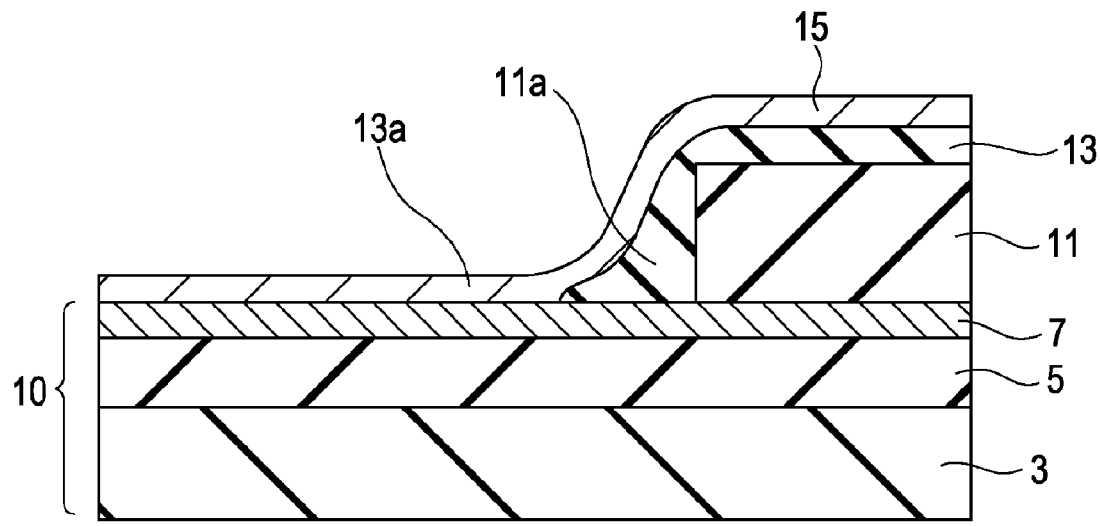
FIG. 3 is a cross-sectional view showing another example of the first embodiment.

In the above-described first embodiment, a description has been made of the case where each of the first opening 11a and the second opening 13a has a connecting-hole shape. However, the shape of the first opening 11a and the second opening 13a is not limited to such a connecting-hole shape. Alternatively, each of the first opening 11a and the second opening 13a may have a step shape that opens in one direction, as shown in FIG. 3, or a groove shape extending in one direction. In such cases, the same advantage as that described above can be achieved.

Figure 4:
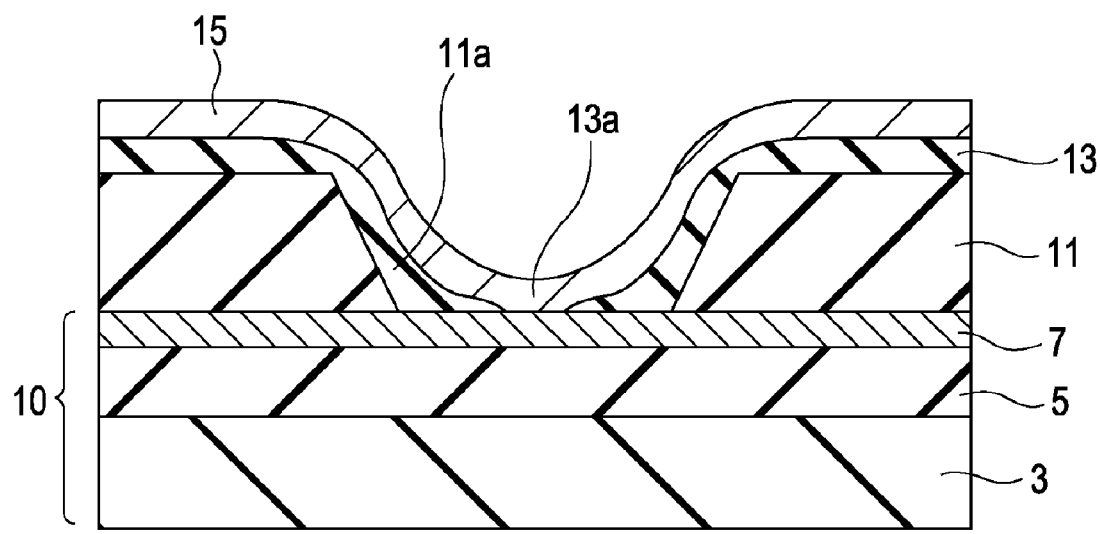
FIG. 4 is a cross-sectional view showing another example of the first embodiment.

In addition, the shape of the side walls of the first opening 11a is not limited to the perpendicular shape shown in FIG. 1 and FIGS. 2A to 2E and may be any shape. For example, as shown in FIG. 4, the side walls of the first opening 11a may have a forward tapered shape in which the diameter of the opening tapers toward the lower part of the opening. In this case, the second insulating film 13 can cover the upper shoulder parts of the first opening 11a so as to have a rounded shape having a larger curvature thereat. Consequently, the effect of preventing a step disconnection of the conductive pattern 15 can be further increased. Alternatively, the side walls of the opening may have a reverse-tapered shape.

In the description of this first embodiment, the substrate 10 in which the conductive layer 7 is formed as a conductive pattern above the supporting substrate 3 is assumed, the conductive layer 7 is exposed on the bottom of the first opening 11a and the second opening 13a, and the conductive pattern 15 is connected to the exposed conductive layer 7. However, the present invention can be applied in a similar manner to a structure in which a substrate is composed of a semiconductor substrate and a diffusion layer is provided as a surface layer of the substrate. In this case, the conductive pattern 15 is connected to the diffusion layer provided as the surface layer of the substrate, and the same advantage as that described above can be achieved.

Furthermore, the first embodiment can also be applied to an electronic device such as a wiring substrate having a multilayer interconnection structure. In such a case, the same advantage as that described above can be achieved.

Second Embodiment

Figure 5:
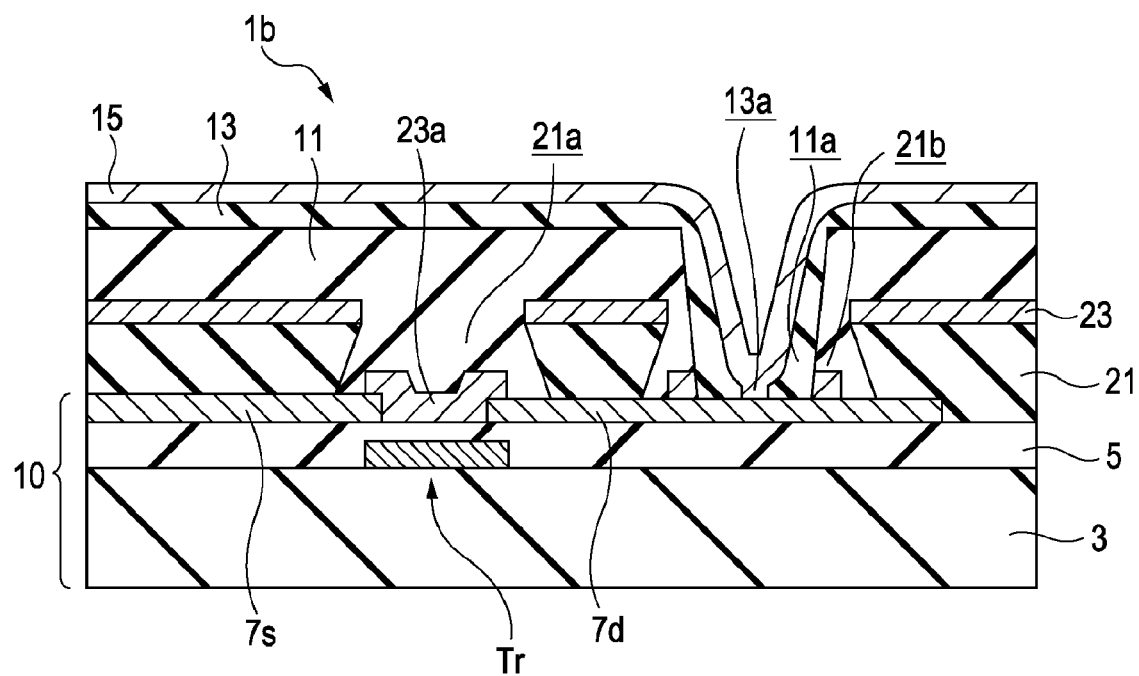
FIG. 5 is a cross-sectional view showing a semiconductor device of a second embodiment.

FIG. 5 is a cross-sectional view of the relevant part illustrating a semiconductor device according to an embodiment of the present invention. A semiconductor device 1b shown in FIG. 5 includes a thin-film transistor Tr.

The structure of the semiconductor device shown in FIG. 5 will now be described with reference to production process views of FIGS. 6A to 7C in the order of the production process. The same components as those in the first embodiment are assigned the same reference numerals, and a description of the common structure is omitted.

Figure 6A:
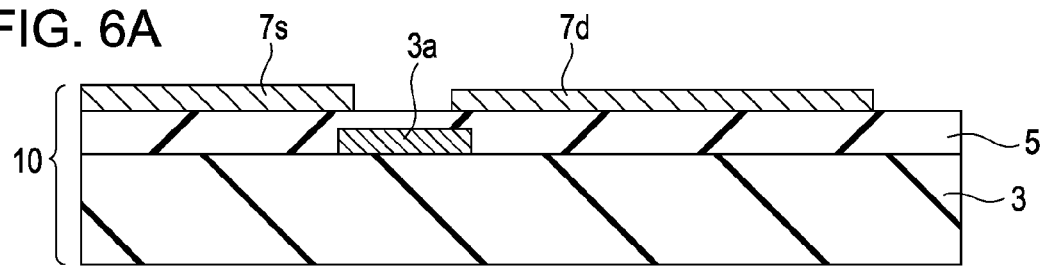
FIGS. 6A to 6D are cross-sectional process views (No. 1) showing steps of producing the semiconductor device of the second embodiment.

First, as shown in FIG. 6A, a gate electrode 3a is pattern-formed on a supporting substrate 3. The pattern formation of the gate electrode 3a is performed by a printing method such as an ink jet method, a microcontact printing method, or a screen printing method, or a photolithography method. For example, in order to form a smaller gate electrode 3a with high accuracy, a pattern formation using a lithography method is preferably performed. In this case, an electrode material layer is formed, a resist pattern is formed on the electrode material layer by a lithography method, and the electrode material layer is then pattern-etched using the resist pattern as a mask. Examples of the electrode material layer include an aluminum (Al) film, a gold (Au) film, a stacked film including a gold (Au) film and a chromium (Cr) film, a silver (Ag) film, a palladium (Pd) film, and a stacked film of these films.

Next, the gate electrode 3a is covered with an interlayer insulating film serving as a gate insulating film 5. A source electrode 7s and a drain electrode 7d are then formed as a conductive layer on the gate insulating film 5 at both sides of the gate electrode 3a. In this embodiment, the structure shown in FIG. 6A is formed as a substrate 10.

Figure 6B:
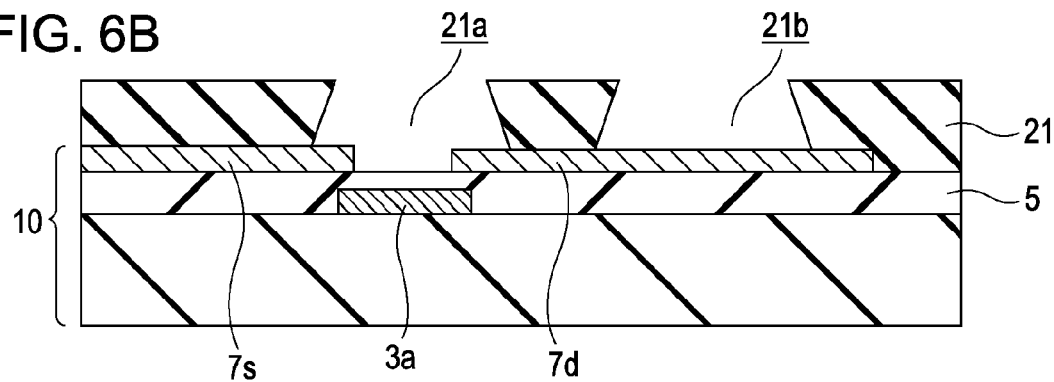

Subsequently, as shown in FIG. 6B, an insulating partition wall 21 is formed on the substrate 10 on which the source electrode 7s and the drain electrode 7d are provided as a conductive pattern. The partition wall 21 includes a first opening 21a and a second opening 21b. The first opening 21a reaches an edge of the source electrode 7s, an edge of the drain electrode 7d, and the gate insulating film 5 located between these electrodes 7s and 7d, and is provided above the gate electrode 3a. The second opening 21b is provided so as to reach at least one of the source electrode 7s and the drain electrode 7d. In this embodiment, the second opening 21b reaching the drain electrode 7d is shown in the figure as an example. Alternatively, two or more second openings 21b may be provided so as to reach each of the source electrode 7s and the drain electrode 7d.

It is important that the partition wall 21 be formed so that a semiconductor layer to be formed in the subsequent step is deposited on and between portions of the partition wall 21. This partition wall 21 has a thickness that is sufficiently larger than the thickness of the semiconductor layer. The partition wall 21 is formed so that the side walls of the first opening 21a and the second opening 21b are perpendicularly disposed. More preferably, the partition wall 21 has a reverse-tapered shape in which the diameters of the openings taper toward the upper part of the openings.

The shape of the side walls of the first opening 21a and the second opening 21b in the partition wall 21 may be a reverse-tapered shape in which the angle of slope is substantially uniform, as shown in FIG. 6B. Alternatively, the partition wall 21 may be composed of a stacked film in which the lower sublayers have a larger openings. Alternatively, regarding the shape of the side walls of the first opening 21a and the second opening 21b, only upper part of the side walls may have a reverse-tapered shape as long as the semiconductor layer to be formed in the subsequent step is deposited on and between portions of the partition wall 21.

Examples of a method of forming the above-mentioned partition wall 21 include a method of forming by photopatterning using a photosensitive resin and a method of forming by combining formation of an insulating thin film and etching thereof. Examples of the insulating thin film include resin films such as a PMMA film and inorganic insulating films such as a silicon nitride ($SiN_x$) film and a silicon oxide ($SiO_x$) film.

The partition wall 21 having the openings 21a and 21b whose side walls form a reverse-tapered shape is formed by, for example, using a photosensitive resin and performing lithography in which the exposure conditions are adjusted. A partition wall having a multilayer structure can also be formed by a similar method. For example, in order to form such a partition wall using a photosensitive resin, photosensitivity of a first layer disposed at the bottom and that of a second layer disposed on the first layer are made different from each other. Alternatively, the first layer may be formed using a photosensitive resin, and the second layer may be formed using a material that can be selectively patterned with the photosensitive resin of the first layer remaining untouched. Furthermore, when the partition wall 21 is formed by combining formation of insulating thin films and etching thereof, etching selectivity between a first layer disposed at the bottom and a second layer disposed on the first layer may be imparted.

Figure 6C:
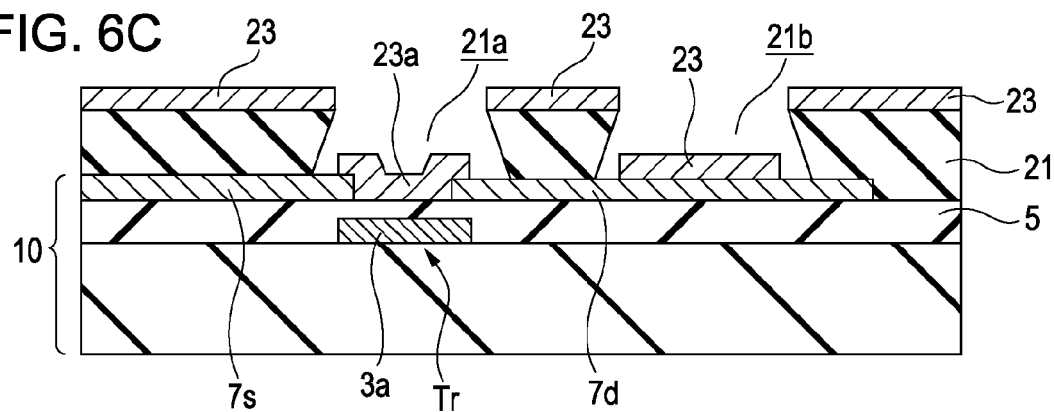

After the above-described partition wall 21 is formed, as shown in FIG. 6C, a semiconductor layer 23 is deposited from above the partition wall 21. Thus, a channel-portion semiconductor layer 23a composed of the semiconductor layer 23 is formed on the bottom of the first opening 21a so as to be separated from the portions disposed on the partition wall 21. Here, the semiconductor layer 23 is deposited over the entire surface of the substrate 10 by, for example, a vacuum evaporation method. Thereby, a semiconductor layer 23 is provided on the bottom of the second opening 21b so as to be separated from the semiconductor layer 23 provided on the partition wall 21.

This semiconductor layer 23 is made of an organic semiconductor such as pentacene, a thiophene oligomer such as sexithiophene, or polythiophene. When a method, such as an ink jet method, by which both patterning and formation of a film can be simultaneously performed, is employed, the semiconductor layer 23 may be selectively formed only on the bottom surface of the first opening 21a in the partition wall 21, and the resulting semiconductor layer 23 may be used as the channel-portion semiconductor layer 23a.

Thus, the bottom-gate bottom-contact thin-film transistor Tr is prepared. In this thin-film transistor Tr, the source electrode 7s and the drain electrode 7d are provided on the gate insulating film 5 covering the gate electrode 3a. In addition, the channel-portion semiconductor layer 23a is provided so as to cover an edge of the source electrode 7s, an edge of the drain electrode 7d, and above the gate electrode 3a.

Figure 6D:
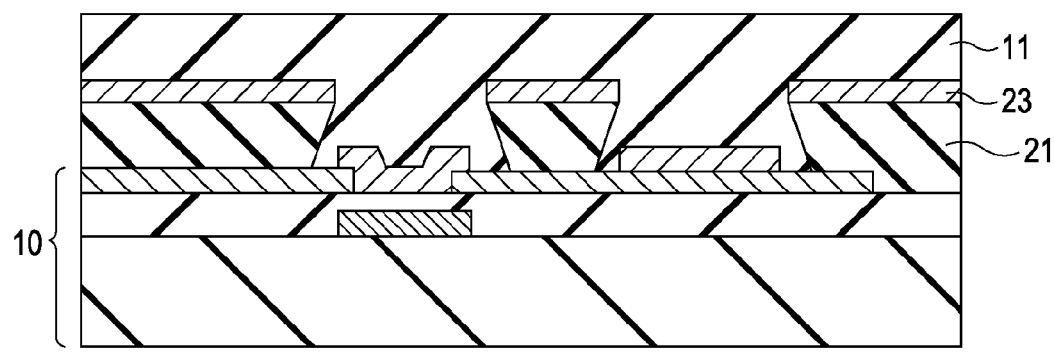

Next, as shown in FIG. 6D, a first insulating film 11 is deposited so as to cover the partition wall 21 serving as a pattern layer provided on the substrate 10. The first insulating film 11 is preferably formed as a planarizing insulating film, as shown in FIG. 6D. Alternatively, even when steps due to the presence of the partition wall 21 remain on the surface of the first insulating film 11, it is sufficient that the first insulating film 11 fills spaces between portions of the partition wall 21 so as to decrease the difference in level of the steps. The first insulating film 11 may have a single-layer structure or a laminated structure as long as the shape of the first insulating film 11 satisfies the above structure.

In order to form the first insulating film 11 as a planarizing insulating film, an insulating film having a thickness such that the partition wall 21 is satisfactorily covered is deposited, and the surface of the insulating film may then be planarized by etching-back or chemical mechanical polishing (CMP).

Figure 7A:
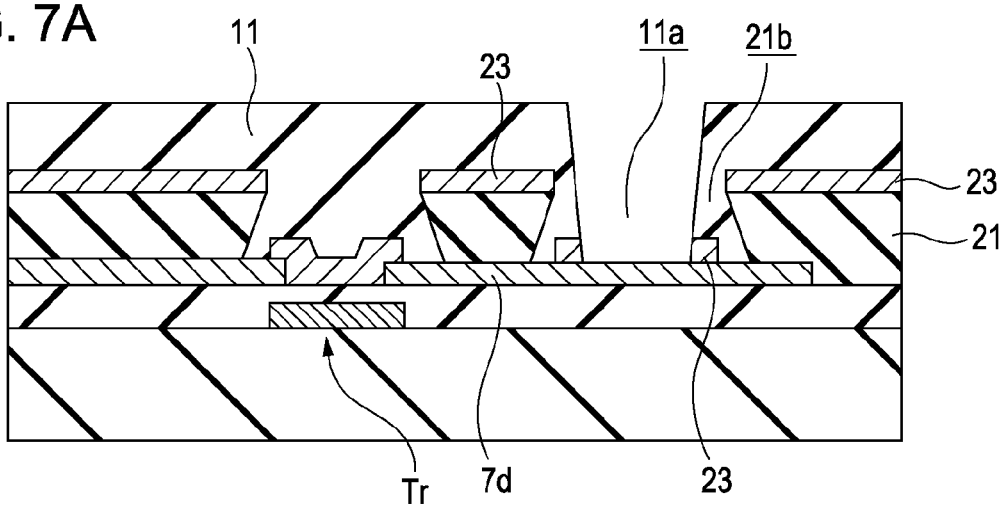
FIGS. 7A to 7C are cross-sectional process views (No. 2) showing steps of producing the semiconductor device of the second embodiment.

Subsequently, as shown in FIG. 7A, a first connecting hole 11a is formed, as an opening reaching the drain electrode 7d, on the semiconductor layer 23 disposed on the bottom of the second opening 21b in the first insulating film 11 and the partition wall 21. The first connecting hole 11a is formed so as to be insulated from the semiconductor layer 23 disposed on the partition wall 21 in the inside of the second opening 21b in the partition wall 21. This first connecting hole 11a is formed by, for example, etching using a resist pattern as a mask.

If a plurality of second openings 21b are provided in the partition wall 21, the first connecting hole 11a is formed at a position to be connected to an electrode provided on the first insulating film 11.

Figure 7B:
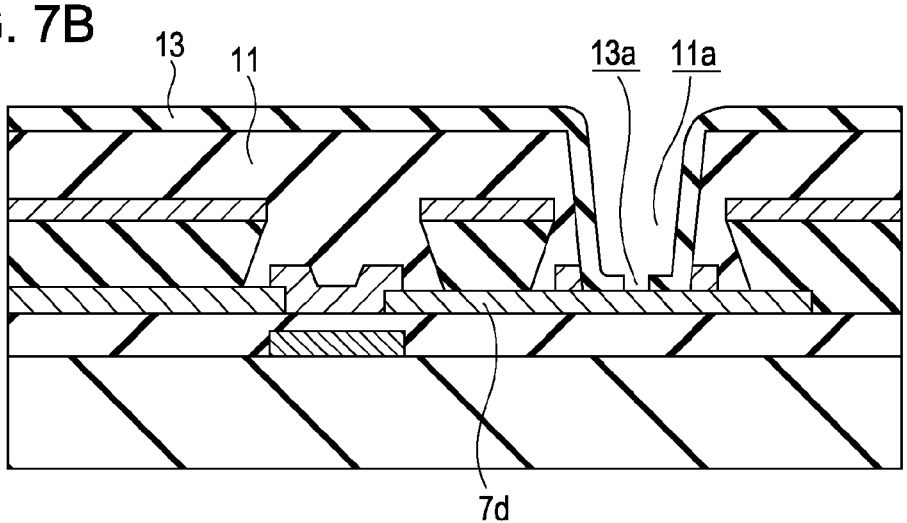

Next, as shown in FIG. 7B, a second insulating film 13 is deposited on the first insulating film 11 so as to cover the inner walls of the first connecting hole 11a. As a result, upper corners of the opening of the first connecting hole 11a are covered with the second insulating film 13.

Figure 7C:
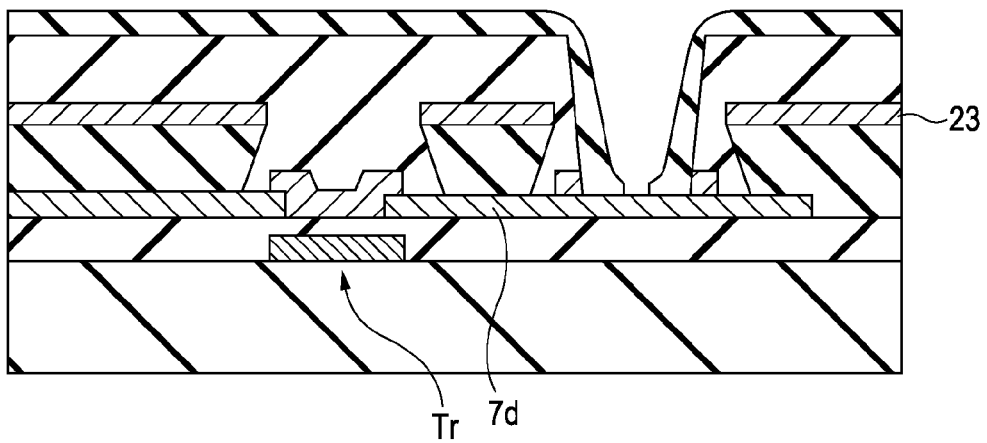

Subsequently, as shown in FIG. 7C, the second insulating film 13 including a second connecting hole 13a is reflowed (fluidized) by a heat treatment. Thereby, portions of the second insulating film 13 covering the corners of the first connecting hole 11a in the first insulating film 11 are further formed into a rounded shape.

From the step of forming the second insulating film 13 to the step of reflow are performed as in the first embodiment described with reference to FIG. 2C to 2E.

Subsequently, as shown in FIG. 5, a conductive pattern 15 connected to the drain electrode 7d through the second connecting hole 13a is formed on the second insulating film 13 to form wirings. The conductive pattern 15 is formed as in the first embodiment. An insulating isolation portion (not shown) covering the periphery of the conductive pattern 15 is then optionally formed on the second insulating film 13.

Thus, the semiconductor device 1b which includes the thin-film transistor Tr and in which the conductive pattern 15 connected to the thin-film transistor Tr is arranged on the insulating films 11 and 13 covering the thin-film transistor Tr is obtained.

In the semiconductor device 1b having the structure produced as described above, the channel-portion semiconductor layer 23a is separately formed on the bottom of the first opening 21a utilizing the difference in level of the patterned insulating partition wall 21. Therefore, the channel-portion semiconductor layer 23a can be finely formed.

In addition, the conductive pattern 15 connected to the thin-film transistor Tr including the channel-portion semiconductor layer 23a extends to the upper part of the first insulating film 11, which is formed so as to cover the difference in level of the partition wall 21, thereby forming wirings. Therefore, a step disconnection of the conductive pattern 15 due to the difference in level of the partition wall 21 does not occur. In particular, in the case where the first insulating film 11 is formed as a planarizing insulating film, since the underlayer of the conductive pattern 15 is flat, the conductive pattern 15 that is reliably arranged on the first insulating film 11 can be produced.

Furthermore, in particular, in addition to the first opening 21a in which the channel-portion semiconductor layer 23a is to be formed, the second opening 21b reaching the drain electrode 7d is provided in advance in the partition wall 21 for separating the semiconductor layer 23. In addition, the first connecting hole 11a is provided inside the second opening 21b, and the second insulating film 13 is provided so as to cover the side walls of the first connecting hole 11a. Accordingly, insulation between the semiconductor layer 23 located on the partition wall 21 and the conductive pattern 15 can be achieved.

According to the above structure, the semiconductor device 1b includes the channel-portion semiconductor layer 23a that is finely patterned by a deposition from above the partition wall 21, and in addition, the conductive pattern 15 can be formed without being affected by the presence of the semiconductor layer 23 remaining on the partition wall 21. Accordingly, the production of a multilayered semiconductor device 1b and a highly integrated semiconductor device 1b can be realized.

In the above structure, the second insulating film 13 covering the inner walls of the first connecting hole 11a formed in the first insulating film 11 is provided, and the conductive pattern 15 is provided on the second insulating film 13. Therefore, the upper corners of the first connecting hole 11a provided in the first insulating film 11 are covered with the second insulating film 13 in a rounded shape, and thus preventing a step disconnection of the conductive pattern 15 at the upper corners.

Accordingly, since the conductive pattern 15 arranged on the insulating films 11 and 13 can be reliably connected to the drain electrode 7d as in the first embodiment, the production yield of the semiconductor device 1b can be improved.

The above-described semiconductor device 1b of the second embodiment can be used as a driving substrate of a display unit by forming the conductive pattern 15 as a pixel electrode. In such a case, the pixel electrode (i.e., conductive pattern 15) is preferably made of a reflective material. In the display unit including a driving substrate having the above structure, since the pixel electrode can be reliably arranged, a display can be performed with high reliability. By forming the pixel electrode (i.e., conductive pattern 15) using a reflective material, a display can be performed without an effect of, for example, coloring due to the presence of the semiconductor layer 23, which is an underlayer of the pixel electrode.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a substrate;
   a first insulating film that includes a first opening reaching the substrate and that is provided on the substrate;
   a second insulating film that includes a second opening reaching the substrate through the first opening of the first insulating film and that covers the first insulating film, the second insulating film comprising a reflow film, and the second opening having upper shoulder parts each of which has a rounded shape; and
   a conductive pattern that is provided on the second insulating film so as to be in electrical communication with the substrate through the second opening of the second insulating film.

2. The semiconductor device according to claim 1, wherein the second insulating film covers upper shoulder parts of the first opening in the first insulating film so as to have a rounded shape thereat.

3. The semiconductor device according to claim 1, wherein the second insulating film comprises a photosensitive composition.

4. The semiconductor device according to claim 1, wherein the conductive pattern is connected to a diffusion layer provided on the surface of the substrate.

5. The semiconductor device according to claim 1, wherein the conductive pattern is connected to a conductive layer provided on the surface of the substrate.

6. The semiconductor device according to claim 1, wherein the first insulating film is a planarizing film having a thickness such that the first insulating film covers a pattern layer provided on the substrate.

7. An electronic device comprising a semiconductor device, the semiconductor device comprising:
   a substrate;
   a first insulating film that includes a first opening reaching the substrate and that is provided on the substrate;
   a second insulating film that includes a second opening reaching the substrate through the first opening of the first insulating film and that covers the first insulating film, the second insulating film comprising a reflow film, and the second opening having upper shoulder parts each of which has a rounded shape; and
   a conductive pattern that is provided on the second insulating film so as to be connected to a conductive layer provided on the surface of the substrate through the second opening of the second insulating film.

* * * * *